(12) United States Patent
Chang et al.

(10) Patent No.: US 10,475,662 B2
(45) Date of Patent: Nov. 12, 2019

(54) METHOD OF FORMING SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Wei-Hsin Liu, Changhua County (TW); Ying-Chih Lin, Tainan (TW); Jui-Min Lee, Taichung (TW); Gang-Yi Lin, Taitung County (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/158,316

(22) Filed: Oct. 12, 2018

(65) Prior Publication Data
US 2019/0172722 A1    Jun. 6, 2019

(30) Foreign Application Priority Data
Dec. 4, 2017    (CN) .......................... 2017 1 1262212

(51) Int. Cl.
| | | |
|---|---|---|
| *H01L 21/311* | (2006.01) | |
| *H01L 21/308* | (2006.01) | |
| *H01L 27/105* | (2006.01) | |
| *H01L 21/033* | (2006.01) | |

(52) U.S. Cl.
CPC .... *H01L 21/31144* (2013.01); *H01L 21/0337* (2013.01); *H01L 21/0338* (2013.01); *H01L 21/3086* (2013.01); *H01L 21/3088* (2013.01); *H01L 27/1052* (2013.01)

(58) Field of Classification Search
USPC .......................................... 438/706
See application file for complete search history.

(56) References Cited

U.S. PATENT DOCUMENTS

| | | |
|---|---|---|
| 7,732,343 B2 | 6/2010 | Niroomand et al. |
| 2006/0263699 A1 | 11/2006 | Abatchev et al. |
| 2007/0048674 A1 | 3/2007 | Wells |
| 2008/0090418 A1* | 4/2008 | Jeon ............... H01L 21/0337 438/689 |

* cited by examiner

*Primary Examiner* — Roberts P Culbert
(74) *Attorney, Agent, or Firm* — Winston Hsu

(57) ABSTRACT

A method of forming a semiconductor memory device includes following steps. First of all, a target layer is provided, and a mask structure is formed on the target layer, with the mask structure including a first mask layer a sacrificial layer and a second mask layer. The first mask layer and the second mask layer include the same material but in different containing ratio. Next, the second mask layer and the sacrificial layer are patterned, to form a plurality of mandrels. Then, a plurality of spacer patterns are formed to surround the mandrels, and then transferred into the first mask layer to form a plurality of opening not penetrating the first mask layer. Finally, the first mask layer is used as a mask to etch the target layer, to form a plurality of target patterns.

10 Claims, 5 Drawing Sheets

METHOD OF FORMING SEMICONDUCTOR DEVICE

BACKGROUND OF THE INVENTION

1. Field of the Invention

The present invention relates to a method of forming a semiconductor device, and more particularly to a method of forming a semiconductor device through a multiple patterning process.

2. Description of the Prior Art

Fabrication of microstructures requires tiny elements of precisely controlled size formed in a material layer of an appropriate substrate such as semiconductor substrate/layers, dielectric layers and/or metal layers. These tiny elements are generated by patterning the abovementioned substrate/layers, for instance, by performing photolithography and etching processes. For this purposes, in conventional semiconductor techniques, a mask layer is formed on the target, and these tiny elements are defined in the mask layer and followed by being transferred to the target layer. Generally, the mask layer may include or is formed by means of a layer of photoresist that is patterned by lithographic process and/or patterned hard mask including the patterns transferred from the patterned photoresist.

As feature sizes are decreased by the complexity of currently integrated circuits, the existing single patterning process has met its bottleneck to successfully render the features. That is, the overlay accuracy and the resolution among this feature have to push the lithographic limit further to create even smaller, more densely packed devices. Therefore, it is still urgent to those of skilled in the art to develop or improve the conventional scheme for these tiny elements.

SUMMARY OF THE INVENTION

It is one of the primary objectives of the present invention to provide a method of forming a semiconductor device, in which an improve sidewall image transfer (SIT) technique is provided to avoid the subsequent processes being affected while removing a particular portion of mask patterns, so as to obtain target patterns with an improved structure. That is, the forming method of the present invention enables to increase the integrity of the semiconductor device under a simplified process, and to achieve a better device performance thereby.

To achieve the purpose described above, the present invention provides a method of forming a semiconductor device including the following steps. Firstly, a target layer is provided, and a stacked structure is formed on the target layer, with the stacked structure including a first mask layer, a sacrificial layer and a second mask layer stacked on one over another, wherein the first mask layer and the second mask layer includes the same material composition, and each material of the material composition is in different ratio in the first mask layer and the second mask layer. Next, the second mask layer and the sacrificial layer are patterned, to form a plurality of mandrels. Then, a plurality of spacer patterns is formed to surround the mandrels respectively, and the spacer patterns are then transferred into the first mask layer, to form a plurality of openings in the first mask layer, with the openings being not penetrated through the first mask layer. Finally, after completely removing the spacer patterns, the target layer is patterned through the first mask layer and the openings, to form a plurality target patterns in the target layer.

In summary, the forming method of the present invention utilizes the etching selectivity between two stacked mask layers, as well as the thickness differences between the two stacked mask layers and other layers, to etch the bottom layer of the two stacked mask layers into a battlement-like structure. Then, the battlement-like structure of the bottom layer of the two stacked mask layers is further used as a mask to further pattern the layers underneath into separated patterns or separated structures. That is, the forming method of the present invention enables to avoid any interference to the subsequent processes caused while removing the particular portions (the top portions for example) of the mask patterns, so as to achieve a better device performance thereby.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 are schematic diagrams illustrating a method of forming a semiconductor device according to a first preferred embodiment of the present invention, in which:

FIG. 1 shows a cross-sectional view of a semiconductor device after forming a photoresist layer;

FIG. 2 shows a cross-sectional view of a semiconductor device after performing a patterning process;

FIG. 3 shows a cross-sectional view of a semiconductor device after forming a spacer material layer;

FIG. 4 shows a cross-sectional view of a semiconductor device after performing an etching back process;

FIG. 5 shows a cross-sectional view of a semiconductor device after removing mandrels.

FIG. 6 to FIG. 10 are schematic diagrams illustrating a method of forming a semiconductor device according to a second preferred embodiment of the present invention, in which:

FIG. 6 shows a cross-sectional view of a semiconductor device after forming mandrels;

FIG. 7 shows a cross-sectional view of a semiconductor device after performing an etching process;

FIG. 8 shows a cross-sectional view of a semiconductor device after performing another etching process;

FIG. 9 shows a cross-sectional view of a semiconductor device after performing a removing process;

FIG. 10 shows a cross-sectional view of a semiconductor device after patterning a target layer.

DETAILED DESCRIPTION

To provide a better understanding of the presented invention, preferred embodiments will be described in detail. The preferred embodiments of the present invention are illustrated in the accompanying drawings with numbered elements.

Figure 1:
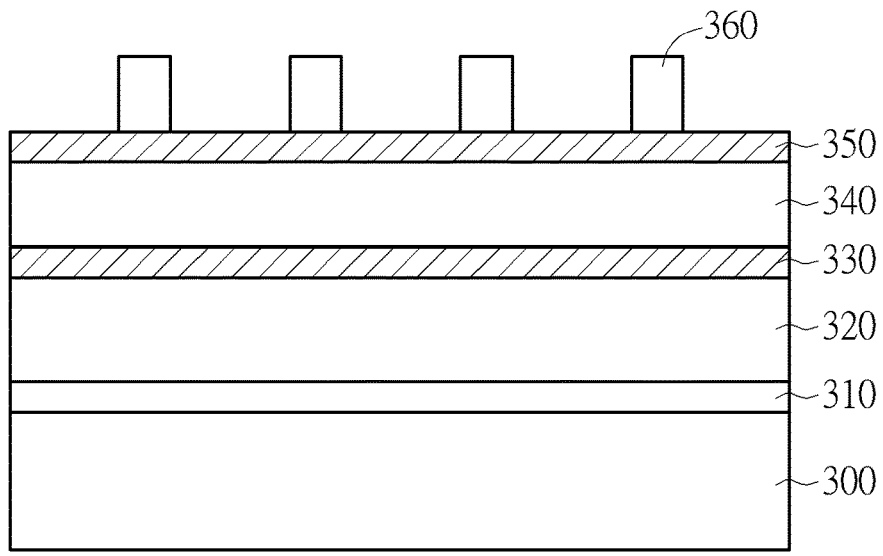

Please refer to FIG. 1 to FIG. 5, which are schematic diagrams illustrating a forming process of a semiconductor device according to the first preferred embodiment of the present invention. First of all, a substrate layer 300 is provided, and the substrate layer 300 for example includes a semiconductor substrate like a silicon substrate, a silicon containing substrate, an epitaxial silicon substrate or a silicon-on-insulator (SOI) substrate, and a target layer 310 is formed on the substrate 300. The target layer 310 may be a hard mask layer as shown in FIG. 1, including silicon nitride (SiN) or silicon carbonitride (SiCN), or a material layer (not shown in the drawings), including any suitable material like a dielectric material or a conductive material. In another embodiment, the target layer 310 may also include a multilayer structure (not shown in the drawings) having both of a material layer (not shown in the drawings) and a hard mask layer (not shown in the drawings) stacked from one over another.

Then, at least one sidewall image transfer (SIT) technique is performed to pattern the target layer 310. Namely, the target layer 310 is patterned through a single self-aligned double patterning (SADP) process, or a cross SADP process. Precisely speaking, the SADP process includes firstly forming a mask structure and a photoresist layer 360 on the target layer 310, and the mask structure includes a sacrificial layer 320, a mask layer 330, a sacrificial layer 340 and a mask layer 350 stacked from one over another, as shown in FIG. 1. In the present embodiment, the mask layer 330 and the mask layer 350 preferably include the same material, such as silicon oxynitride (SiON), and the sacrificial layer 320 and the sacrificial layer 340 may include the same or different material, such as an organic dielectric material like silicon oxide, but not limited thereto.

Figure 2:
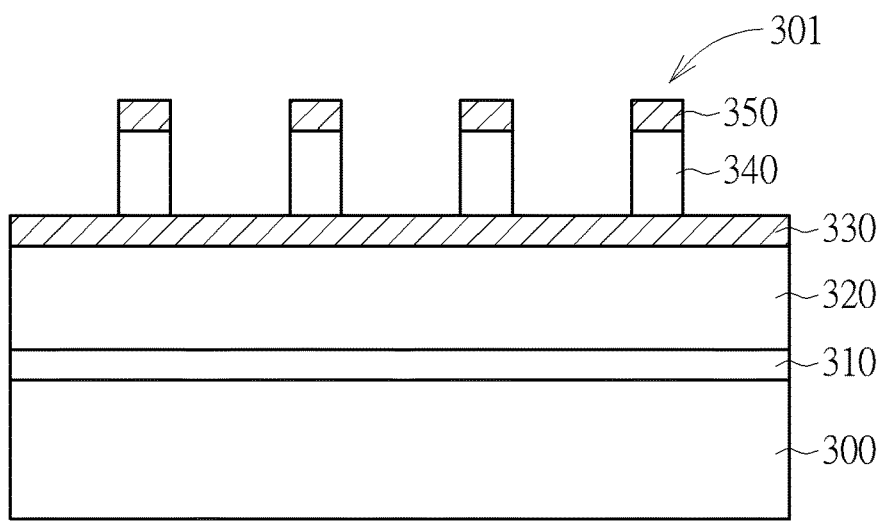

The photoresist layer 360 defines a plurality of patterns on the mask structure, with the patterns having the same pitch therebetwee, and a patterning process is performed through the photoresist layer 360, to transfer the patterns into the mask layer 350 and the sacrificial layer 340 underneath to form a plurality of mandrels 301 in accordance with the patterns of the photoresist layer 360, as shown in FIG. 2. The photoresist layer 360 is then removed after the patterning process.

Figure 3:
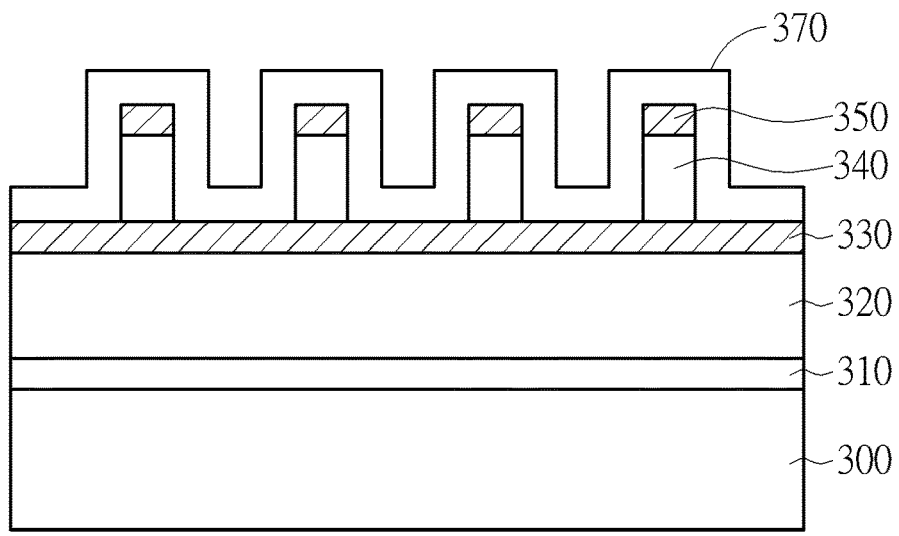
Figure 4:
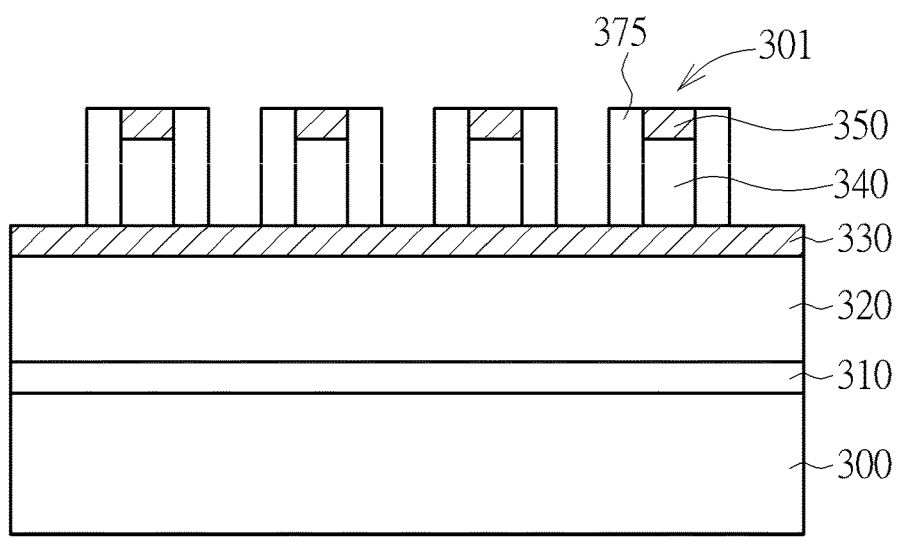

Next, as shown in FIG. 3, a spacer material layer 370 is formed on the substrate 300, to cover each of the mandrels 301 and the mask layer 330 underneath. The spacer material layer 370 preferably includes a material having etching selectivity related to that of the mask layers 330, 350, such as silicon nitride or silicon carbonitride. Then, an etching back process is performed by using the etching selectivity of the spacer material layer 370, to remove a portion of the spacer material layer 370 to expose a top surface (namely the mask layer 350) of each of the mandrels 301 and a top surface of the mask layer 330. That is, a plurality of spacer patterns 375 surrounded at two sides of each mandrel 301 respectively is formed thereby, as shown in FIG. 4.

Figure 5:
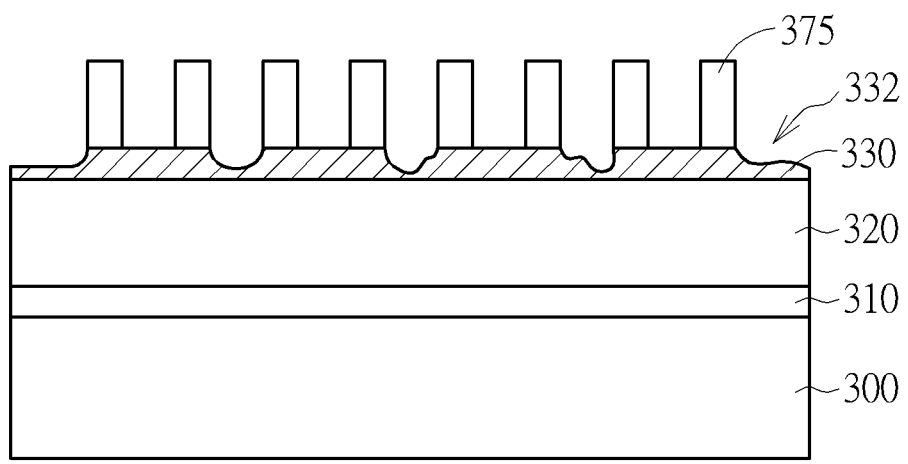

Following these, the mandrels 301 are completely removed after the etching back process, and spacer patterns 375 are than used as an etching mask to carry out the subsequent processes, further patterning the mask layer 330, the sacrificial layer 320, the target layer 310 and/or the substrate 300 underneath to form required structures or patterns. However, surface of a portion of the mask layer 330 which is not covered by the mandrels 301 may also be partially removed while removing the mandrels 301, because the top potion (namely the mask layer 350) of the mandrels 301 and the exposed mask layer 330 have the same material. Under such performance, the partially removed portions of the mask layer 330 may be recessed to form a plurality of trenches 332, as shown in FIG. 5, after completely removing the mandrels 301. The trenches 332 have recessed and uneven surfaces in comparison with other portions of the mask layer 330 (the potions being covered by the mandrels 301). In some situation, each of the trenches 332 may have different depths and shapes due to various etching profile among various portions, as shown in FIG. 5. Accordingly, those trenches 332 with uneven surfaces and various shape in the mask layer 330 will further be transferred into the layers underneath while performing the subsequent patterning processes, such that, the integrity of patterns or structures formed in the subsequent processes may be seriously affected thereby.

The following description will detail the different embodiments of the forming method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
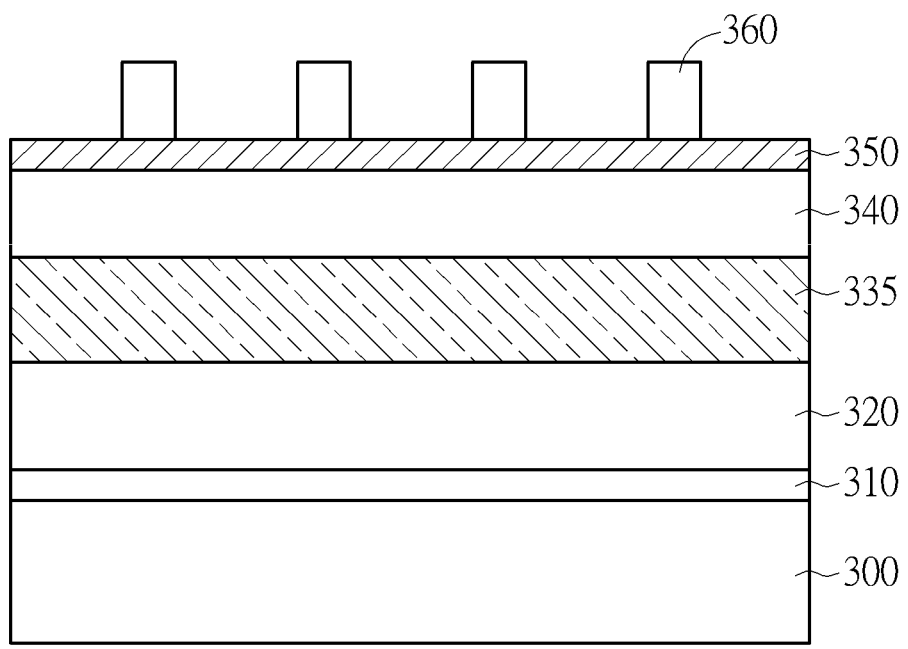

Please refer to FIGS. 6-10, which are schematic diagrams illustrating a forming process of a semiconductor device according to the second preferred embodiment of the present invention. The formal steps in the present embodiment are similar to those in the aforementioned first preferred embodiment, including using the SADP process to pattern the target layer 310 and forming the mask structure and the photoresist layer 360 on the target layer 310, and which will not redundantly described herein. The differences between the present embodiment and the aforementioned embodiment are that, the mask structure of the present embodiment includes a sacrificial layer 320, a mask layer 335, a sacrificial layer 340 and a mask layer 350 stacked from one over another, as shown in FIG. 6. In the present embodiment, materials of the mask layer 335 and the mask layer 350 preferably have a significant etching selectivity, such as 4 to 6, but not limited thereto. Also, the mask layer 335 and the mask layer 350 preferably include the same material composition, but proportions of components in the mask layer 335 and the mask layer 350 are preferably different from each other. For example, in one embodiment, the mask layer 335 and the mask layer 350 may both include silicon oxynitride, with a concentration of oxygen being substantially equal to a concentration of silicon in the mask layer 350, and with the concentration of oxygen or the concentration of silicon being substantially greater than a concentration of nitrogen in the mask layer 350. That is, the mask layer 350 may perform like a SiO like layer. On the other hand, a concentration of nitrogen is substantially equal to a concentration of silicon in the mask layer 335, and the concentration of nitrogen or the concentration silicon is substantially greater than a concentration of oxygen in the mask layer 335, so as to make the mask layer 335 to perform like a SiN like layer. In another embodiment, the mask layer 335 may also performed like a silicon like layer, with a concentration of silicon therein being substantially greater than a concentration of nitrogen and a concentration of oxygen therein, and the mask layer 350 may optional contains the same concentration of silicon, nitrogen and oxygen.

It is also noted that, the mask layer 335 preferably includes a greater thickness related to that of the mask layer 350 or the sacrificial layer 320 or the target layer 310 underneath, and the thickness of the mask layer 335 is substantially about two to three times greater than that of the mask layer 350, or the sacrificial layer 320, or the target layer 310, but not limited thereto. Similar to what is disclosed in FIGS. 2 and 4 of the aforementioned first preferred embodiment, a patterning process is performed through the photoresist layer 360, to form the mandrels 301 in accordance with the patterns of the photoresist layer 360, and the spacer pattern 375 surrounded at the two sides of each of mandrels 301 are then formed, after removing the photoresist layer 360. The detailed formations of the mandrels 301 and the spacer patterns 375 are similar to those in the aforementioned first preferred embodiment, and which will not redundantly described herein.

Figure 7:
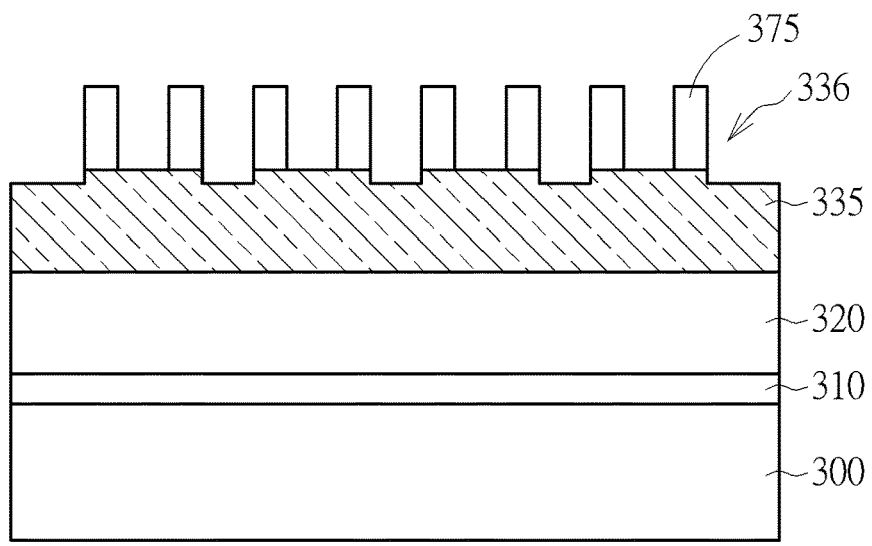

Through this performance, the etching selectivity between the mask layers 350, 335 may be utilized to avoid any possible etching to the exposed portions of the mask layer 335 (namely, the portions which are not covered by the mandrels 301) while removing the top portions of the mandrels 301 (namely, the mask layer 350). In other words, the forming method of the present embodiment enables to reduce the height differences between the portions of the mask layer 335 which is covered and is not covered by the mandrels 301, after removing the mandrels 301. That is, only a plurality of shallow trenches 336 is formed at the portions of the mask layer 335 which are not covered by the mandrels 301, as shown in FIG. 7, and the height difference of the shallow trenches 336 related to other portions of the mask layer 335 is only about 5 angstroms to 20 angstroms.

Figure 8:
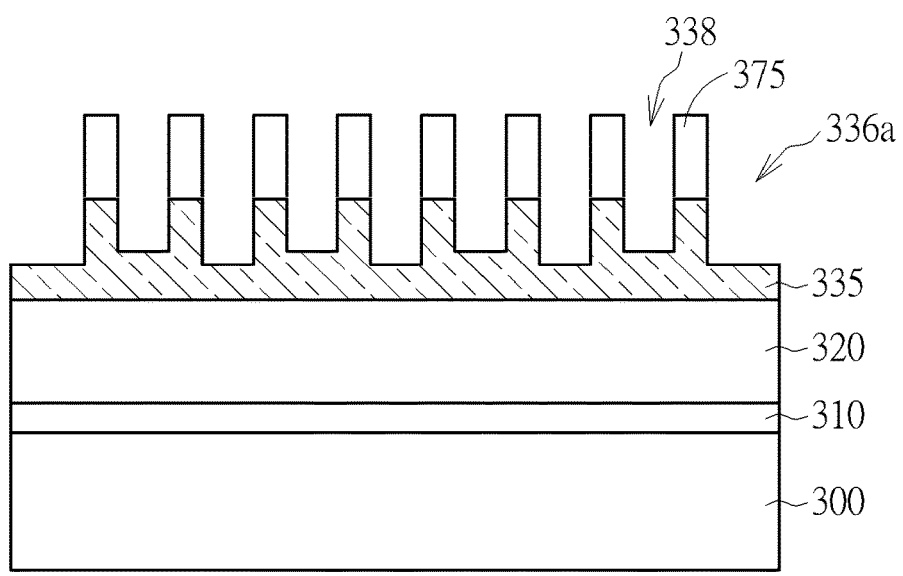

Next, an etching process is performed by using the spacer patterns 375 as an etching mask, to pattern the mask layer 335. It is noted that, the mask layer 335 is only partially removed through the etching process, to form a plurality of openings 336a, 338 which is not penetrated through the mask layer 335. In other words, the mask layer 335 are not etched into separated patterns after the etching process, with a bottom portion of the mask layer 335 being still in overall connection, and with only a top portion of the mask layer 335 being etched, therefore performing like a battlement-like structure, as shown in FIG. 8. The openings 338 are etched from the portions of the mask layer 335 which are originally covered by the mandrels 301, and the openings 336a are etched from the portions of the mask layer 335 which are not covered by the mandrels 301. That is, each of the openings 338 has a relative smaller depth than that of the openings 336a, as shown in FIG. 8. The depth difference between the openings 336a and the openings 338 are preferably controlled at about 5-20 angstroms.

Figure 9:
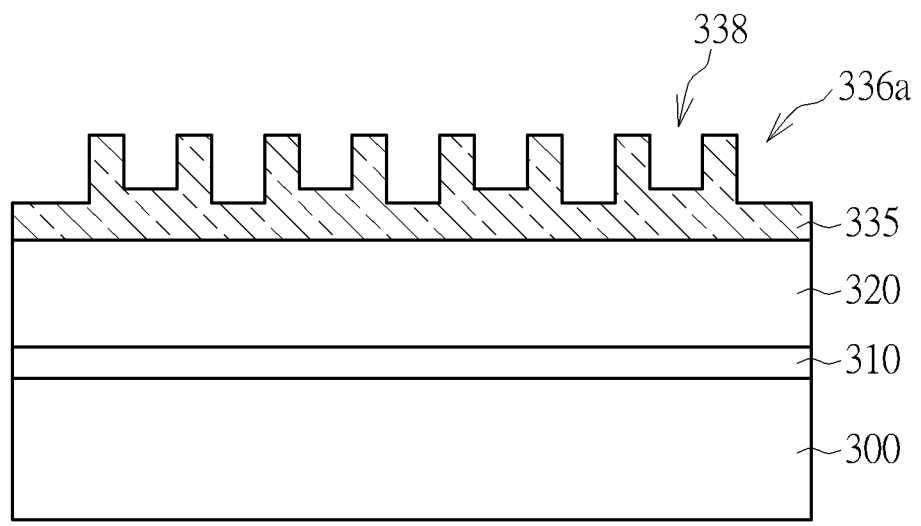
Figure 10:
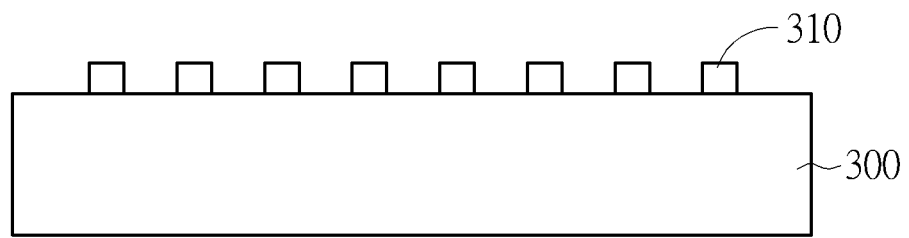

After that, as shown in FIG. 9, the spacer patterns 375 are completely removed, and the sacrificial layer 320 and the target layer 310 are patterned by using the etched mask layer 335 as an etching mask, sequentially transferring the height difference of the battlement-like structure of the etched mask layer 335 into the layers underneath. Through this performance, the sacrificial layer 320 and the target layer 310 are patterned into a plurality of sacrificial patterns (not shown in the drawings) being separated from each other, and a plurality of target patterns as shown in FIG. 10. Then, the etched mask layer 335 and the sacrificial layer 320 are completely removed to obtain the target patterns as shown in FIG. 10.

Through to the aforementioned processes, the forming method of the present embodiment is completed. In the subsequent processes, the target patterns as shown in FIG. 10 may be used to further pattern the substrate 300 or other layers underneath, for forming corresponding structures or patterns. According to the forming method of the present embodiment, the etching selectivity between the mask layer 335 and the mask layer 350, as well as the thickness differences between the mask layer 335, the mask layer 350 and the sacrificial layer 320, are used to from the etched mask layer 335 with the battlement-like structure, and the etched mask layer 335 with the battlement-like structure is then used as an etching mask to pattern the layers with a relative smaller thickness underneath into a plurality of separated patterns or separated structures. In this way, it is sufficient to avoid the uneven or unintegrated structure caused while removing the top portions of the mask patterns (such as the mandrels 301) to further affect the subsequent processes. That is, the forming method of the present embodiment enables to increase the integrity of the semiconductor under a simplified process, and to achieve a better device performance thereby.

People skilled in the art should fully understand that the forming method of the present invention is not limited to be accomplished through the aforementioned steps and may further include other processes. For example, in one embodiment by using a cross SADP process to pattern the target layer 310, a plurality of first patterns (not shown in the drawings) for example extending along a first direction (not shown in the drawings) is firstly formed on the target layer 310 through a SADP process. Then, the mask structure is formed, with the sacrificial layer 320 having the planar top surface directly covering the first patterns, and another SADP process is performed according to the aforementioned processes, to form a plurality of second patterns (not shown in the drawings) extending along a second direction (not shown in the drawings) being different from the first direction. After that, the first patterns and the second patterns are both used to pattern the target layer 310, to form a plurality of target patterns (not shown in the drawings) which is crossed to each other. Through this performance, it is also sufficient to avoid the uneven or unintegrated structure caused while removing the mask patterns (such as the mandrels 301), under a simplified process, so as to achieve a better device performance thereby.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a target layer;
   forming a stacked structure on the target layer, the stacked structure comprising a first mask layer, a sacrificial layer and a second mask layer stacked on one over another, wherein the first mask layer and the second mask layer comprises the same material composition, and proportions of components are different in the first mask layer and the second mask layer;
   patterning the second mask layer and the sacrificial layer to form a plurality of mandrels;
   forming a plurality of spacer patterns surrounding the mandrels respectively;
   transferring the spacer patterns into the first mask layer, to form a plurality of openings in the first mask layer, wherein the openings are not penetrated through the first mask layer; and
   after completely removing the spacer patterns, patterning the target layer through the first mask layer and the openings, to form a plurality target patterns in the target layer.

2. The method of forming a semiconductor device according to claim 1, wherein the first mask layer and the second mask layer comprises silicon oxynitride.

3. The method of forming a semiconductor device according to claim 2, wherein the first mask layer is a silicon nitride like layer and the second mask layer is silicon oxide like layer.

4. The method of forming a semiconductor device according to claim 2, wherein a concentration of silicon is greater than a concentration of nitrogen and a concentration of oxygen in the first mask layer, and a concentration of silicon is equal to a concentration of nitrogen and a concentration of oxygen in the second mask layer.

5. The method of forming a semiconductor device according to claim 1, wherein a thickness of the first mask layer is greater than a thickness of the target layer.

6. The method of forming a semiconductor device according to claim 1, wherein a thickness of the first mask layer is greater than a thickness of the second mask layer and a thickness of the sacrificial layer.

7. The method of forming a semiconductor device according to claim 1, further comprising:
completely removing the mandrels before transferring the spacer patterns.

8. The method of forming a semiconductor device according to claim 1, wherein the forming of the spacer patterns further comprises:
forming a spacer material layer to cover each of the mandrels and the first mask layer; and
partially removing the spacer material layer, to form the spacer patterns.

9. The method of forming a semiconductor device according to claim 1, wherein the target patterns are separately formed on the substrate.

10. The method of forming a semiconductor device according to claim 9, further comprising:
performing a sidewall image transferring process, to form a plurality of separated patterns on the target layer; and
transferring the patterns into the target layer while patterning the target layer, to form the target patterns.

* * * * *